United States Patent
Endo (10) Patent No.: US 11,526,074 B2
(45) Date of Patent: Dec. 13, 2022

(54) MOLDING APPARATUS FOR MOLDING COMPOSITION ON SUBSTRATE USING MOLD, MOLDING METHOD, AND METHOD FOR MANUFACTURING ARTICLE

(71) Applicant: CANON KABUSHIKI KAISHA, Tokyo (JP)

(72) Inventor: Takanori Endo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 164 days.

(21) Appl. No.: 16/297,455

(22) Filed: Mar. 8, 2019

(65) Prior Publication Data
US 2019/0278169 A1  Sep. 12, 2019

(30) Foreign Application Priority Data
Mar. 12, 2018  (JP) .............................. JP2018-044356

(51) Int. Cl.
*G03F 7/00* (2006.01)

(52) U.S. Cl.
CPC ................. *G03F 7/0002* (2013.01)

(58) Field of Classification Search
CPC ............................ G03F 7/0002; B05D 3/0406
See application file for complete search history.

(56) References Cited

U.S. PATENT DOCUMENTS

| | | | | |
|---|---|---|---|---|
| 2010/0031833 A1* | 2/2010 | Kasumi | .................. | B82Y 10/00 101/4 |
| 2011/0236579 A1* | 9/2011 | Sato | ....................... | B29C 59/02 427/277 |
| 2015/0352776 A1* | 12/2015 | Ogasawara | ........... | G03F 7/0002 264/293 |
| 2016/0128171 A1* | 5/2016 | Kuritsyn | ............. | G03F 7/70033 250/504 R |

(Continued)

FOREIGN PATENT DOCUMENTS

| | | |
|---|---|---|
| JP | 2014-056854 A | 3/2014 |
| JP | 2014110367 A | 6/2014 |
| JP | 2017-163039 A | 9/2017 |

(Continued)

OTHER PUBLICATIONS

Zhou, Bin, "How Particle Resuspension from Inner Surfaces of Ventilation Ducts Affects Indoor Air Quality—A Modeling Analysis," Apr. 20, 2011, Aerosol Science and Technology (Year: 2011).*

*Primary Examiner* — Michael M. Robinson
*Assistant Examiner* — Victoria Bartlett
(74) *Attorney, Agent, or Firm* — Canon U.S.A., Inc., IP Division (57) ABSTRACT

A molding apparatus for molding a composition on a substrate using a mold includes a conveying unit configured to convey an object, a holding unit configured to hold the object conveyed by the conveying unit, a supply unit configured to supply gas to an object space surrounding the object held by the holding unit, and a control unit configured (Continued)

to control the supply unit so that a first amount of supply per unit time of the gas to be supplied from the supply unit in a case where the conveying unit is inside the object space is different from a second amount of supply per unit time of the gas to be supplied from the supply unit in a case where the conveying unit is outside the object space.

16 Claims, 9 Drawing Sheets

(56) References Cited

U.S. PATENT DOCUMENTS

2016/0231648 A1\* 8/2016 Hirano ............... B29C 64/20
2019/0011831 A1\* 1/2019 Li ........................ G03F 7/0002

FOREIGN PATENT DOCUMENTS

| JP | 2017-208424 A | 11/2017 |
| KR | 20110107288 A | 9/2011 |
| KR | 20150073847 A | 7/2015 |

\* cited by examiner

MOLDING APPARATUS FOR MOLDING COMPOSITION ON SUBSTRATE USING MOLD, MOLDING METHOD, AND METHOD FOR MANUFACTURING ARTICLE

BACKGROUND OF THE INVENTION

Field of the Invention

The present disclosure relates to a molding apparatus for molding a composition on a substrate using a mold, a molding method, and a method for manufacturing an article.

Description of the Related Art

The miniaturization of a semiconductor device and microelectromechanical systems (MEMS) is increasingly required, and in addition to a conventional photolithography technique, a microfabrication technique for molding an imprint material on a substrate using a mold, and forming a composition of the imprint material on the substrate draws attention. This technique is also termed an imprint technique and can form a several-nanometer-order microstructure on a substrate. For example, as an imprint technique, there is a light-curing method. An imprint apparatus employing the light-curing method first applies a light-curable imprint material to a shot area, which is an imprint area on a substrate. Next, while aligning a mold (an original or a template) and the shot area, the imprint apparatus brings the mold and the imprint material into contact with each other (imprints the mold into the imprint material), thereby filling the mold with the imprint material. Then, the imprint apparatus causes the imprint material to cure by irradiating the imprint material with light and then separates the mold and the imprint material from each other, thereby forming a composition of the imprint material in the shot area on the substrate.

In the imprint apparatus, in a case where a foreign substance is attached to the mold or the substrate, the mold may deform, or the composition to be formed on the substrate may result in a defect.

In response, Japanese Patent Application Laid-Open No. 2014-056854 discusses the following technique. A substrate and a mold are placed opposed to each other with a predetermined gap between the substrate and the mold, thereby defining the space between the substrate and the mold. Then, gas having the effect of reducing a defect is supplied to the space to form a first air flow. Further, to purify the periphery of the space between the substrate and the mold, a second air flow is formed. Then, to prevent the second air flow from being involved in the first air flow, a third air flow is applied between the first and second air flows. This maintains the purity of the periphery of the mold and the substrate while filling the space between the substrate and the mold with gas.

As in Japanese Patent Application Laid-Open No. 2014-056854, in an imprint apparatus that supplies gas to the space between a substrate and a mold or the periphery of the space, a conveying unit for conveying the substrate or the mold can enter the space where the air flow of the supplied gas is formed. In this case, the air flow can hit the conveying unit, whereby a foreign substance attached to the conveying unit can be scattered. Further, such an air flow hitting the conveying unit can also change the flow of the air flow, and a foreign substance attached to the components of the imprint apparatus can be scattered. Then, the scattered foreign substance may be attached to the mold or the substrate and cause the deformation of the mold or a defect in a composition formed on the substrate.

SUMMARY OF THE INVENTION

The present disclosure is directed to providing a molding apparatus, a molding method, and a method for manufacturing an article that are capable of preventing a foreign substance from being attached to a mold or a substrate.

According to an aspect of the present disclosure, a molding apparatus for molding a composition on a substrate using a mold includes a conveying unit configured to convey an object, a holding unit configured to hold the object conveyed by the conveying unit, a supply unit configured to supply gas to an object space surrounding the object held by the holding unit, and a control unit configured to control the supply unit so that a first amount of supply per unit time of the gas to be supplied from the supply unit in a case where the conveying unit is inside the object space is different from a second amount of supply per unit time of the gas to be supplied from the supply unit in a case where the conveying unit is outside the object space.

Further features of the present disclosure will become apparent from the following description of exemplary embodiments with reference to the attached drawings.

DESCRIPTION OF THE EMBODIMENTS

Exemplary embodiments of the present disclosure will be described in detail below with reference to the drawings. In the following exemplary embodiments, an example is described where an imprint apparatus is used as a molding apparatus for molding a composition on a substrate using a mold. In the drawings, similar members are designated by the same reference numbers, and are not redundantly described.

Figure 1:
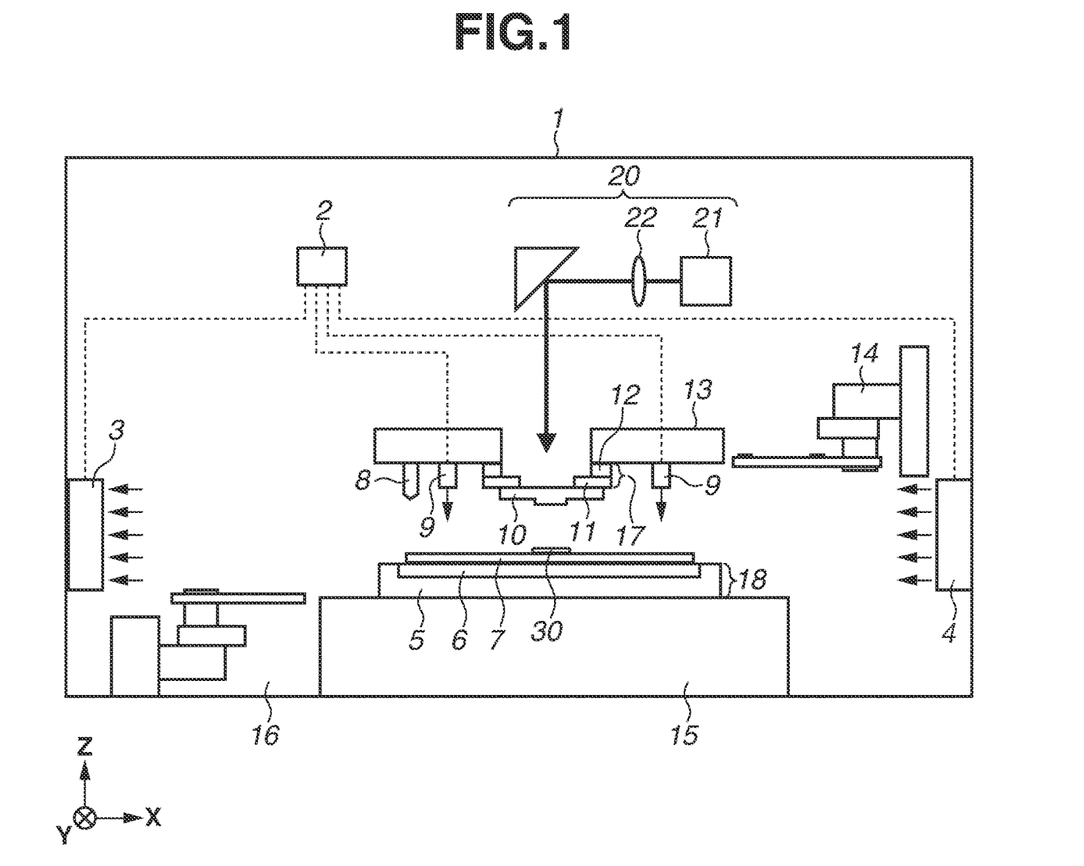
FIG. 1 is a diagram illustrating an imprint apparatus.

A first exemplary embodiment will be described. FIG. 1 is a diagram illustrating an imprint apparatus. An imprint apparatus 1 (a molding apparatus) brings an imprint material supplied onto a substrate 7 (an object) into contact with a mold 10 (an object). Then, the imprint apparatus 1 gives curing energy to the imprint material, thereby molding a composition of the cured product to which an uneven pattern of the mold 10 is transferred.

In this case, as the imprint material, a curable composition that cures by being given curing energy (also occasionally referred to as "a resin in an uncured state") is used. As the curing energy, an electromagnetic wave or heat is used. The electromagnetic wave is light, of which the wavelength is selected from the range of 150 nm or more and 1 mm or less, such as infrared light, visible light, or ultraviolet light.

The curable composition is a composition that cures by being irradiated with light or being heated. Between these curable compositions, the light-curable composition that cures by light contains at least a polymerizable compound and a photopolymerization initiator, and may contain a non-polymerizable compound or a solvent, where necessary. The non-polymerizable compound is at least one type selected from a group of a sensitizer, a hydrogen donor, an internal mold release agent, a surfactant, an antioxidant, and a polymer component.

The imprint material is applied in the form of a film onto the substrate 7 by a spin coater or a slit coater. Alternatively, the imprint material may be applied onto the substrate 7 by a liquid injection head in the form of a droplet or in the form of an island or a film resulting from the connection of a plurality of droplets. The viscosity (the viscosity at 25° C.) of the imprint material is, for example, 1 mPa·s or more and 100 mPa·s or less.

As the substrate 7, glass, a ceramic, a metal, or a resin is used. On the surface of the substrate 7, a member composed of a different material from the substrate 7 may be formed, where necessary. Specific examples of the substrate 7 include a silicon wafer, a compound semiconductor wafer, and a glass wafer including quartz as a material. Alternatively, the substrate 7 may be a glass substrate for manufacturing a replica mask from a master mask by an imprint process.

The mold 10 has a rectangular outer peripheral shape and includes, on its surface (a pattern surface) opposed to the substrate 7, a pattern portion having a three-dimensionally formed pattern (an uneven pattern, such as a circuit pattern, to be transferred to the substrate 7). The mold 10 is composed of a material capable of transmitting light, such as quartz.

In the present exemplary embodiment, a description is given on the assumption that the imprint apparatus 1 employs a light-curing method for causing the imprint material to cure by irradiating the imprint material with light. Further, in the following description, a direction parallel to the optical axis of light emitted to the imprint material on the substrate 7 by an illumination unit 20 is a Z-axis direction, and two directions orthogonal to each other on a plane perpendicular to the Z-axis direction are an X-axis direction and a Y-axis direction.

With reference to FIG. 1, the components of the imprint apparatus 1 will be described. An illumination unit 20 is an illumination method for emitting ultraviolet light to the mold 10 in an imprint process. The illumination unit 20 includes a light source 21 and a plurality of optical systems 22 for adjusting the ultraviolet light emitted from the light source 21 to light appropriate for imprint.

A mold holding unit 17 is a unit for holding and fixing the mold 10 and transferring the pattern of the mold 10 to the substrate 7. The mold holding unit 17 is composed of a mold holding mechanism 11 and a mold driving mechanism 12. The mold holding mechanism 11 includes a holding surface parallel to an XY-plane, and a vacuum suction pad (not illustrated) as a mechanical holding method. The mold holding mechanism 11 holds and fixes the mold 10 on the holding surface using the vacuum suction pad. Further, the mold holding mechanism 11 is held by the mold driving mechanism 12, using a mechanical holding method (not illustrated). The mold driving mechanism 12 is a driving system for positioning the substrate 7 and the mold 10 to determine the distance between the substrate 7 and the mold 10 when the pattern of the mold 10 is transferred to the substrate 7. The mold driving mechanism 12 is driven in the Z-axis direction. Further, since high accuracy positioning is required when the pattern is transferred, the mold driving mechanism 12 may be composed of a plurality of driving systems such as a coarse driving system and a fine driving system. Further, the mold driving mechanism 12 may include the function of adjusting a position not only in the Z-axis direction but also in the X-axis direction, the Y-axis direction, or a θ-direction (rotation about the Z-axis), and a tilt function for correcting the tilt of the mold 10. Further, the mold holding unit 17 is held by a bridge surface plate 13.

A substrate stage 18 is a unit for holding the substrate 7 and correcting (aligning) a translation shift between the substrate 7 and the mold 10 when imprint is performed. The substrate stage 18 is composed of a substrate holding mechanism 6 and a substrate driving mechanism 5. The substrate holding mechanism 6 includes a holding surface parallel to the XY-plane, and a vacuum suction pad (not illustrated) as a mechanical holding method. The substrate holding mechanism 6 holds the substrate 7 on the holding surface using the vacuum suction pad. Further, the substrate holding mechanism 6 is held by the substrate driving mechanism 5, using a vacuum suction pad (not illustrated) as a mechanical holding method. The substrate driving mechanism 5 is a driving system for correcting (aligning) a translation shift between the substrate 7 and the mold 10 and driven in the X-axis direction and the Y-axis direction. Further, the driving system in the X-axis direction and the Y-axis direction may be composed of a plurality of driving systems such as a coarse driving system and a fine driving system. Further, the substrate driving mechanism 5 may include a driving system for adjusting a position in the Z-axis direction, the function of adjusting the position of the substrate 7 in a θ-direction (rotation about the Z-axis), and a tilt function for correcting the tilt of the substrate 7. Further, the substrate stage 18 includes an up-and-down unit (not illustrated) for moving the substrate 7 up and down relative to the substrate holding mechanism 6. The up-and-down unit moves the substrate 7 up relative to the substrate holding mechanism 6 to receive and deliver the substrate 7 from and to a hand portion of a substrate conveying unit 16 that will be described.

A mold conveying unit 14 is a unit for conveying the mold 10 with holding the mold 10 in a suction manner. The mold conveying unit 14 supplies the mold 10 to the mold holding unit 17 with holding the mold 10 and collects the mold 10 from the mold holding unit 17 with holding the mold 10. The mold conveying unit 14 can include an arm driving portion, an arm portion driven by the arm driving portion, and a hand portion that is attached to the arm portion and holds the mold 10. Further, a control unit 2 controls the mold conveying unit 14 to convey the mold 10. The arm driving portion rotationally drives the arm portion along the XY-plane and linearly drives the arm portion in the Z-axis direction. The arm portion and the hand portion may be integrally configured. In a case where the mold conveying unit 14 carries the mold 10 into the mold holding unit 17, the arm driving portion drives the arm portion in the state where the hand portion holds the mold 10. This moves the mold 10 to the position where the mold 10 held by the hand portion and the mold holding unit 17 are opposed to each other. Then, the mold holding unit 17 or the hand portion moves in the Z-axis direction to the position where the mold holding unit 17 and the mold 10 come into in contact with each other, and the mold holding unit 17 holds the mold 10. Further, in a case where the mold conveying unit 14 carries the mold 10 out of the mold holding unit 17, the hand portion moves to the position where the hand portion and the mold 10 are opposed to each other in the state where the mold holding unit 17 holds the mold 10. Then, the mold holding unit 17 or the hand portion moves in the Z-axis direction, and the hand portion holds the mold 10. Further, during the period in which the imprint apparatus 1 performs the imprint process, the mold conveying unit 14 is outside a space (an object space) surrounding the mold 10 held by the mold holding unit 17.

Similarly, a substrate conveying unit 16 is a unit for conveying the substrate 7 with holding the substrate 7 in a suction manner. The substrate conveying unit 16 supplies the substrate 7 to the substrate stage 18 with holding the substrate 7 and collects the substrate 7 from the substrate stage 18 with holding the substrate 7. The substrate conveying unit 16 can include an arm driving portion, an arm portion driven by the arm driving portion, and a hand portion that is attached to the arm portion and holds the substrate 7. Further, the control unit 2 controls the substrate conveying unit 16 to convey the substrate 7. The arm driving portion rotationally drives the arm portion along the XY-plane and linearly drives the arm portion in the Z-axis direction. The arm portion and the hand portion may be integrally configured. In a case where the substrate conveying unit 16 carries the substrate 7 into the substrate stage 18, the arm driving portion drives the arm portion in the state where the hand portion holds the substrate 7. This moves the substrate 7 to the position where the substrate 7 held by the hand portion and the substrate stage 18 are opposed to each other. Then, the substrate stage 18 or the hand portion moves in the Z-axis direction to the position where the up-and-down unit of the substrate stage 18 and the substrate 7 come into contact with each other, and the up-and-down unit of the substrate stage 18 holds the substrate 7. Then, the up-and-down unit moves the substrate 7 down relative to the substrate holding mechanism 6, and the substrate holding mechanism 6 holds the substrate 7. Further, in a case where the substrate conveying unit 16 carries the substrate 7 out of the substrate stage 18, the hand portion moves to a position between the substrate 7 and the substrate holding mechanism 6 in the state where the up-and-down unit of the substrate stage 18 holds the substrate 7. Then, the substrate stage 18 or the hand portion moves in the Z-axis direction, and the hand portion holds the substrate 7. Further, during the period in which the imprint apparatus 1 performs the imprint process, the substrate conveying unit 16 is outside a space (the object space) surrounding the substrate 7 held by the substrate stage 18.

An application unit 8 is a unit for applying an imprint material 30 to the substrate 7. The application unit 8 includes a discharge port (not illustrated) for discharging the imprint material 30 and applies the imprint material 30 from the discharge port to the substrate 7. Further, the amount of the imprint material 30 to be discharged may be determined based on the required thickness of the imprint material 30 or the density of the pattern to be transferred.

A first supply unit 4 supplies gas purified through a filter (not illustrated) in a direction along the X-axis direction toward the space above the substrate stage 18. The first supply unit 4 supplies the purified gas to the object space, whereby it is possible to prevent a foreign substance in the apparatus from being attached to the substrate 7 or the mold 10. In the following description, the flow of the gas supplied from the first supply unit 4 is a first air flow. Further, the gas supplied from the first supply unit 4 can be gas including at least one of, for example, nitrogen, oxygen, carbon dioxide, helium, hydrogen, xenon, and pentafluoropropane.

A second supply unit 9 ejects gas purified through a filter (not illustrated) in a direction along the Z-axis direction toward the substrate 7. The second supply unit 9 is provided surrounding the mold holding unit 17 to divide the object space inside the second supply unit 9 and a space outside the second supply unit 9 by the ejected gas. This can prevent a foreign substance from entering the object space. In the following description, the flow of the gas supplied from the second supply unit 9 is a second air flow. The gas supplied from the second supply unit 9 can also be gas including at least one of, for example, nitrogen, oxygen, carbon dioxide, helium, hydrogen, xenon, and pentafluoropropane.

A collection unit 3 collects the gas supplied from the first supply unit 4 and the second supply unit 9. The collection unit 3 is placed at a position opposed to the first supply unit 4. Consequently, the gas supplied from the first supply unit 4 passes through the object space and is collected by the collection unit 3. Further, the collection unit 3 is placed outside the second supply unit 9 provided surrounding the mold holding unit 17. Consequently, not only gas having passed through the object space but also other gas that does not pass through the object space is collected by the collection unit 3.

The control unit 2 is composed of a computer including a central processing unit (CPU) and a memory. According to a program stored in the memory, the control unit 2 controls the operations and the adjustments of the components of the imprint apparatus 1. Further, the control unit 2 may be composed of a plurality of computers, or may be composed of a single computer. Further, the control unit 2 may be configured integrally (in a common housing) with other portions of the imprint apparatus 1, or may be configured separately (in a different housing) from other portions of the imprint apparatus 1. Further, the control unit 2 controls the amount of supply per unit time of the gas to be supplied from the first supply unit 4 (hereinafter referred to as "the amount of supply from the first supply unit 4"), the amount of collection per unit time of the gas to be collected by the collection unit 3 (hereinafter referred to as "the amount of collection by the collection unit 3"), and the amount of supply per unit time of the gas to be supplied from the second supply unit 9 (hereinafter referred to as "the amount of supply from the second supply unit 9") using, for example, flow rate adjustment valves (not illustrated).

During the period in which the imprint apparatus 1 performs the imprint process, the amount of supply from the first supply unit 4 is $L_{10}$, and the amount of supply from the second supply unit 9 is $L_{20}$. $L_{10}$ and $L_{20}$ are controlled to be the amounts of supply for preventing a foreign substance from being attached or a foreign substance from entering the space over the substrate stage 18. During the period in which the imprint apparatus 1 performs the imprint process, the mold conveying unit 14 is outside the object space. Further, during the period in which the imprint apparatus 1 performs the imprint process, the substrate conveying unit 16 is outside the object space.

Figure 2:
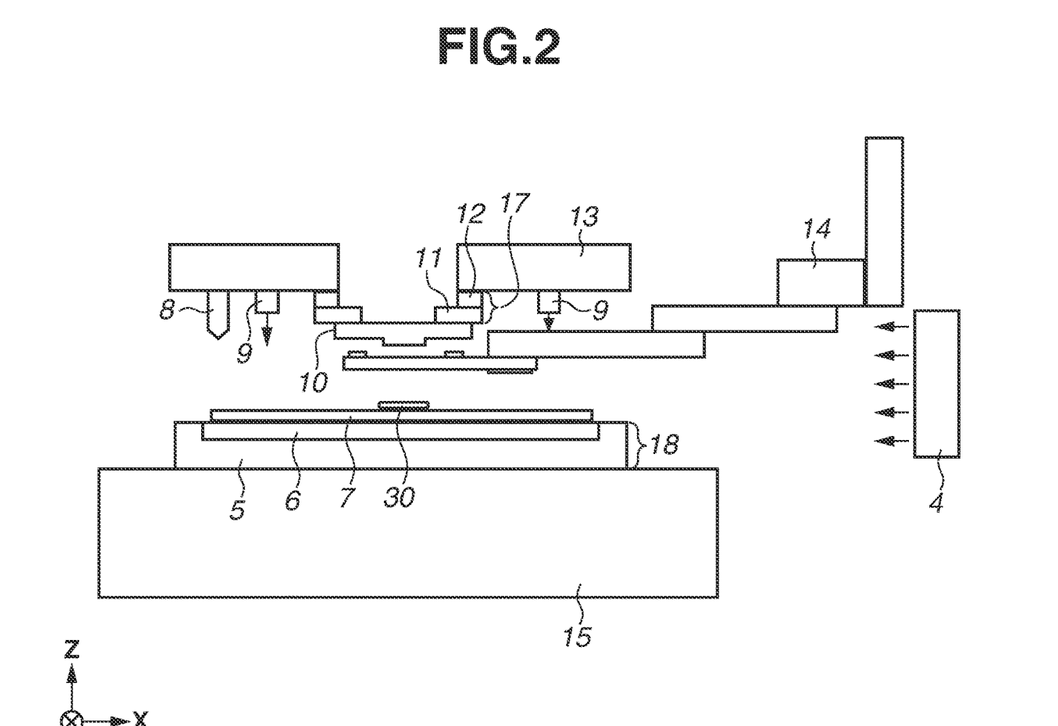
FIG. 2 is a diagram illustrating a mold conveying unit.

FIG. 2 is a diagram illustrating the mold conveying unit 14 conveying the mold 10. In FIG. 2, the mold conveying unit 14 is inside the object space to carry the mold 10 out of the mold holding unit 17. Further, in the object space, the first air flow of the gas supplied from the first supply unit 4 is formed. A foreign substance may exist in the imprint apparatus 1 and may be attached to the components such as the mold conveying unit 14. For example, if the mold conveying unit 14 enters the object space, the foreign substance attached to the mold conveying unit 14 may hit the first air flow, thereby being scattered. Further, the mold conveying unit 14 having entered the object space may change the direction of the first air flow, and the first air flow may hit a portion of the imprint apparatus 1 which the first air flow does not hit in the state where the mold conveying unit 14 is outside the object space, and a foreign substance attached to this portion may be scattered thereby. Further, the second air flow of the gas supplied from the second supply unit 9 is formed around the object space. If the mold conveying unit 14 enters the object space, the foreign substance attached to the mold conveying unit 14 may hit the second air flow, thereby being scattered. Further, the mold conveying unit 14 having entered the object space may change the direction of the second air flow, and the second air flow may hit a portion of the imprint apparatus 1 which the second air flow does not hit in the state where the mold conveying unit 14 is outside the object space, and a foreign substance attached to this portion may be scattered thereby.

In a case where the mold conveying unit 14 enters the object space, the amount of supply from the first supply unit 4 is $L_{11}$ different from $L_{10}$. Further, in a case where the mold conveying unit 14 enters the object space, the amount of supply from the second supply unit 9 is $L_{21}$ different from $L_{20}$. In a case where the foreign substance that can be scattered by the mold conveying unit 14 entering the object space is a foreign substance less likely to be scattered by the first air flow, $L_{11}$ is set to be smaller than $L_{10}$. For example, $L_{11}$ may be set to 90% or less of $L_{10}$. It may be more desirable to set $L_{11}$ to 70% or less (40% or more) of $L_{10}$. If the amount of supply from the first supply unit 4 is set to be small, an increase in a foreign substance included in the object space can be suppressed thereby. This prevents a foreign substance from being attached to the mold 10 or the substrate 7. At this time, the amount of collection by the collection unit 3 may be set to be smaller than the amount of collection by the collection unit 3 before the mold conveying unit 14 enters the object space.

At this time, a foreign substance less likely to be scattered can be determined based on the attribute, such as the grain size, the specific gravity, or the adhesiveness, of the foreign substance. By examining and analyzing in advance what attribute a foreign substance existing in the imprint apparatus 1 has, it is possible to determine whether the foreign substance that can be scattered is a foreign substance less likely to be scattered. Further, it is also possible to determine whether the foreign substance that can be scattered is a foreign substance less likely to be scattered by performing an experiment or a simulation in advance. Then, according to whether the foreign substance that can be scattered is a foreign substance less likely to be scattered, the value of $L_{11}$ is stored in the memory included in the control unit 2, and the control unit 2 controls the first supply unit 4 according to $L_{11}$.

Further, in a case where the foreign substance that can be scattered by the mold conveying unit 14 entering the object space is a foreign substance likely to be scattered by the first air flow, $L_{11}$ is set to be greater than $L_{10}$. For example, $L_{11}$ may be set to 110% or more of $L_{10}$. It may be more desirable to set $L_{11}$ to 130% or more (less than 250%) of $L_{10}$. The amount of supply from the first supply unit 4 is set to be great, whereby the foreign substance is carried to the collection unit 3 by the first air flow and collected by the collection unit 3. This suppresses an increase in a foreign substance included in the object space. This prevents a foreign substance from being attached to the mold 10 or the substrate 7. At this time, the amount of collection by the collection unit 3 may be set to be greater than the amount of collection by the collection unit 3 before the mold conveying unit 14 enters the object space.

At this time, a foreign substance likely to be scattered can be determined based on the attribute, such as the grain size, the specific gravity, or the adhesiveness, of the foreign substance. By examining and analyzing in advance what attribute a foreign substance existing in the imprint apparatus 1 has, it is possible to determine whether the foreign substance that can be scattered is a foreign substance likely to be scattered. Further, by similarly performing an experiment or a simulation in advance, it is also possible to estimate whether the foreign substance that can be scattered is a foreign substance likely to be scattered. Then, according to whether the foreign substance that can be scattered is a foreign substance likely to be scattered, the value of $L_{11}$ is stored in the memory included in the control unit 2, and the control unit 2 controls the first supply unit 4 according to $L_{11}$.

Further, the amount of supply from the second supply unit 9 can also be set similarly to the amount of supply from the first supply unit 4. In a case where the foreign substance that can be scattered by the mold conveying unit 14 entering the object space is a foreign substance less likely to be scattered by the second air flow, $L_{21}$ is set to be smaller than $L_{20}$. For example, $L_{21}$ may be set to 90% or less of $L_{20}$. It may be more desirable to set $L_{21}$ to 70% or less (40% or more) of $L_{20}$. Further, in a case where the foreign substance that can be scattered by the mold conveying unit 14 entering the object space is a foreign substance likely to be scattered by the second air flow, $L_{21}$ is set to be greater than $L_{20}$. For example, $L_{21}$ may be set to 110% or more of $L_{20}$. It may be more desirable to set $L_{21}$ to 130% or more (less than 250%) of $L_{20}$. This can prevent a foreign substance from being attached to the mold 10 or the substrate 7. Further, similarly to $L_{11}$, the value of $L_{21}$ according to the result of estimation obtained by performing an experiment or a simulation is stored in the memory included in the control unit 2, and the control unit 2 controls the second supply unit 9 according to $L_{21}$.

However, in a case where there is a difference in the likelihood of scattering between the foreign substance that can be scattered by the second air flow and the foreign substance that can be scattered by the first air flow, an increase or a decrease in the amount of supply from the second supply unit 9 may be set to be different from an increase or a decrease in the amount of supply from the first supply unit 4. That is, even in a case where $L_{11}$ is set to be greater than $L_{10}$, $L_{21}$ may be set to be smaller than $L_{20}$, or the other way around. At this time, the amount of collection by the collection unit 3 may be determined based on the result of comparing the sum of $L_{10}$ and $L_{20}$ ($L_{10}+L_{20}$) and the sum of $L_{11}$ and $L_{21}$ ($L_{11}+L_{21}$).

Further, in the present exemplary embodiment, a case has been described where the mold conveying unit 14 conveys the mold 10. Also in a case where the substrate conveying unit 16 conveys the substrate 7, it is, similarly, possible to prevent a foreign substance from being attached to the mold 10 or the substrate 7 by controlling the amount of supply from the first supply unit 4 and the amount of supply from the second supply unit 9.

Based on the above, according to the imprint apparatus according to the present exemplary embodiment, it is possible to prevent a foreign substance from being attached to the mold 10 or the substrate 7 by controlling the amount of supply from at least either one of the first supply unit 4 and the second supply unit 9. Further, it is also possible to prevent a foreign substance from being attached to the mold 10 or the substrate 7 by controlling the amount of collection by the collection unit 3.

Next, an imprint apparatus according to a second exemplary embodiment will be described. Matters not mentioned here can follow the first exemplary embodiment.

In the second exemplary embodiment, a description is given of an exemplary embodiment in which, when the mold conveying unit 14 conveys the mold 10, the amount of supply per unit time of the gas to be supplied from at least either one of the first supply unit 4 and the second supply unit 9 is controlled.

Figure 3:
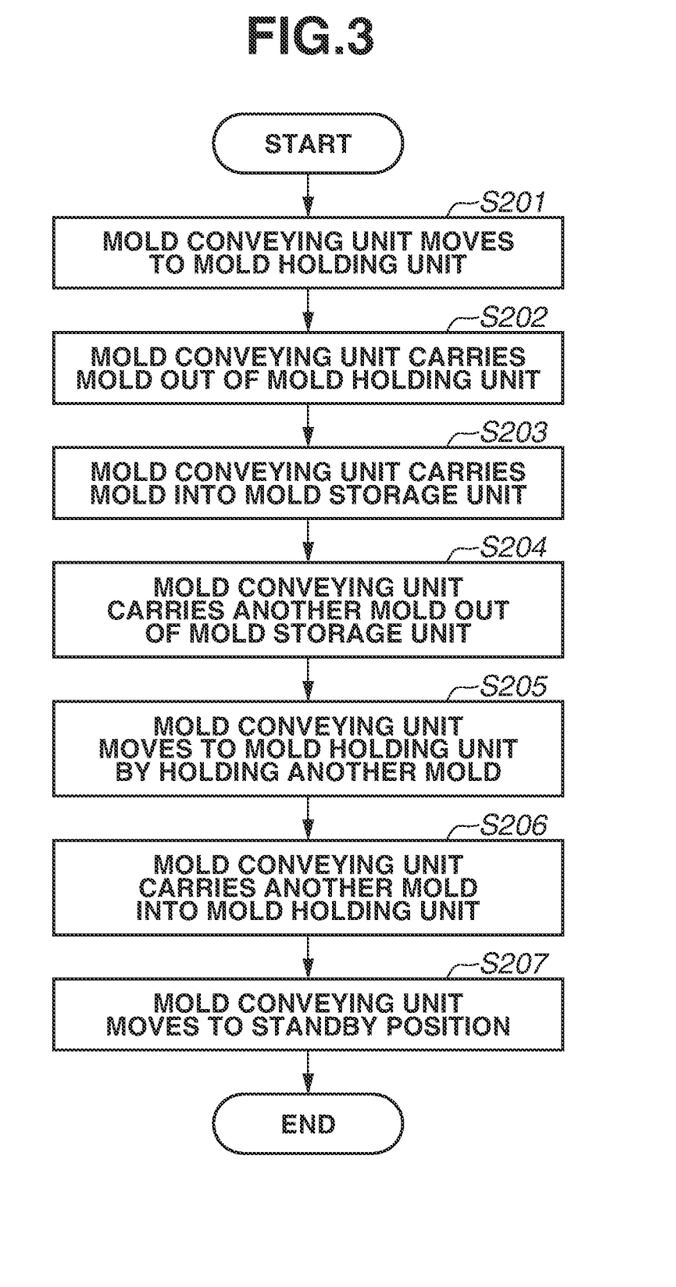
FIG. 3 is a flowchart illustrating a sequence in which the mold conveying unit conveys a mold with holding the mold.
Figure 4:
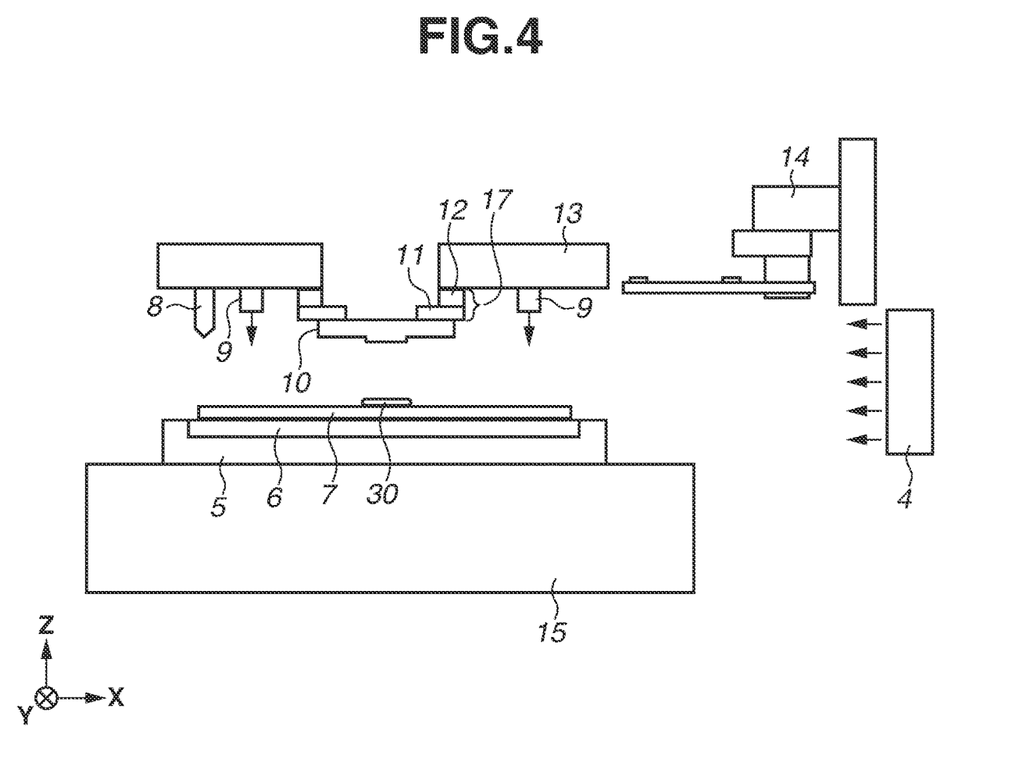
FIG. 4 is a diagram illustrating the mold conveying unit waiting at a standby position.

FIG. 3 is a flowchart illustrating a sequence in which the mold conveying unit 14 conveys the mold 10. FIG. 3 illustrates an example where, after the mold 10 held by the mold conveying unit 14 is carried out, the mold 10 is carried into the mold holding unit 17. Further, FIGS. 4 to 8 are diagrams illustrating the mold conveying unit 14 conveying the mold 10. Before the sequence in which the mold conveying unit 14 conveys the mold 10 is started, the mold conveying unit 14 waits at a standby position as illustrated in FIG. 4. At this time, the mold conveying unit 14 is not inside the object space. Further, the amount of supply from the first supply unit 4 and the amount of supply from the second supply unit 9 at this time are $L_{10}$ and $L_{20}$, respectively.

Figure 5:
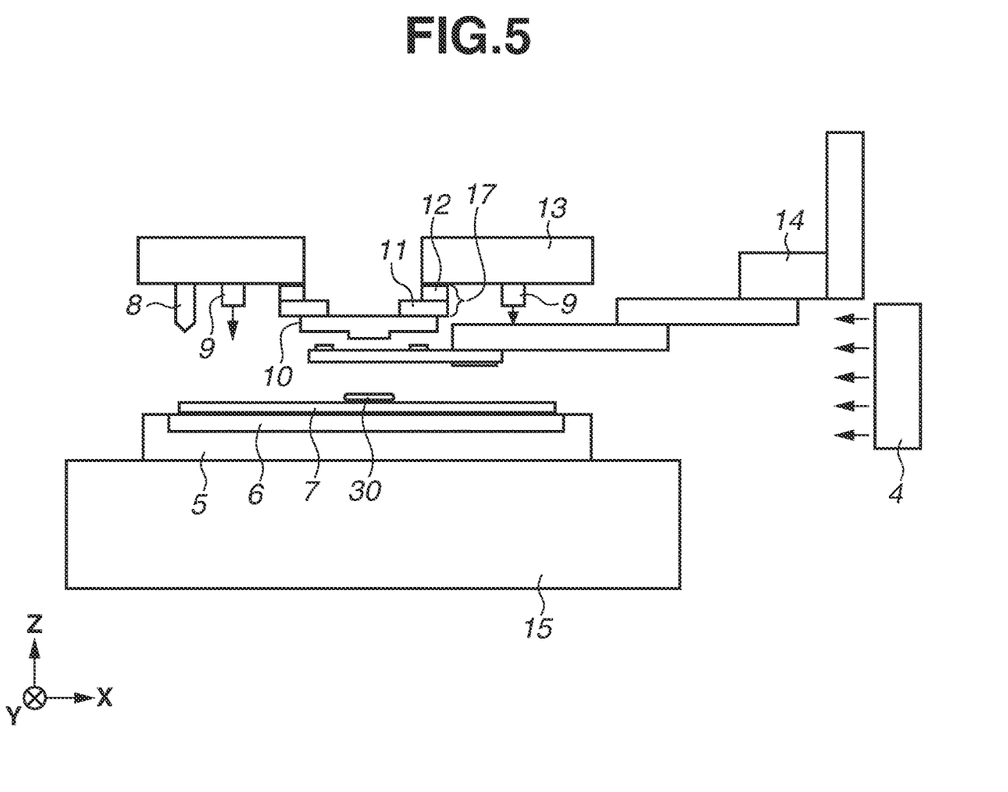
FIG. 5 is a diagram illustrating the mold conveying unit having moved to a mold holding unit.

If the sequence in which the mold conveying unit 14 conveys the mold 10 is started, then in step S201, the mold conveying unit 14 moves to the mold holding unit 17. As illustrated in FIG. 5, the mold conveying unit 14 moves to the position where the mold conveying unit 14 can carry the mold 10 out. That is, the mold conveying unit 14 enters the object space. The amount of supply from the first supply unit 4 and the amount of supply from the second supply unit 9 at this time are $L_{11}$ and $L_{21}$, respectively. In this case, to prevent a foreign substance from being scattered, $L_{11}$ is set to be smaller than $L_{10}$. For example, $L_{11}$ may be set to 90% or less of $L_{10}$. It may be more desirable to set $L_{11}$ to 70% or less (40% or more) of $L_{10}$. Similarly, $L_{21}$ is set to be smaller than $L_{20}$ to prevent the foreign substance from being scattered. For example, $L_{21}$ may be set to 90% or less of $L_{20}$. It may be more desirable to set $L_{21}$ to 70% or less (40% or more) of $L_{20}$. Further, similarly to the first exemplary embodiment, $L_{11}$ may be set to be greater than $L_{10}$ depending on the foreign substance that can be scattered. For example, $L_{11}$ may be set to 110% or more of $L_{10}$. It may be more desirable to set $L_{11}$ to 130% or more (less than 250%) of $L_{10}$. Further, similarly to the first exemplary embodiment, $L_{21}$ may be set to be greater than $L_{20}$ depending on the foreign substance that can be scattered. For example, $L_{21}$ may be set to 110% or more of $L_{20}$. It may be more desirable to set $L_{21}$ to 130% or more (less than 250%) of $L_{20}$. Further, the amount of collection by the collection unit 3 may be similarly controlled.

Figure 6:
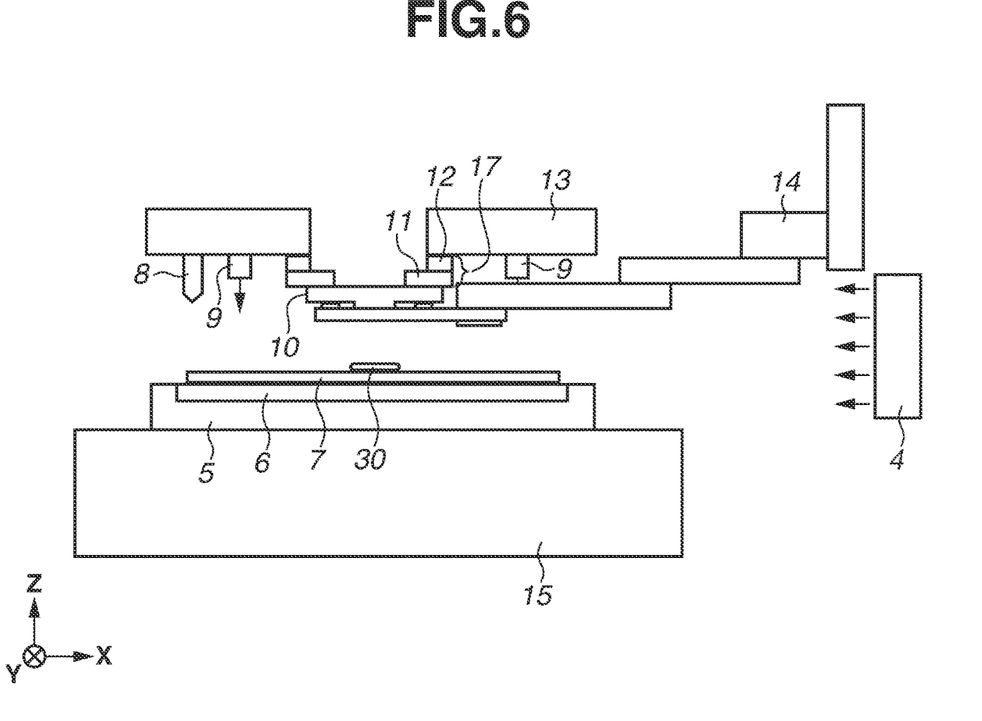
FIG. 6 is a diagram illustrating the mold conveying unit in contact with the mold.
Figure 7:
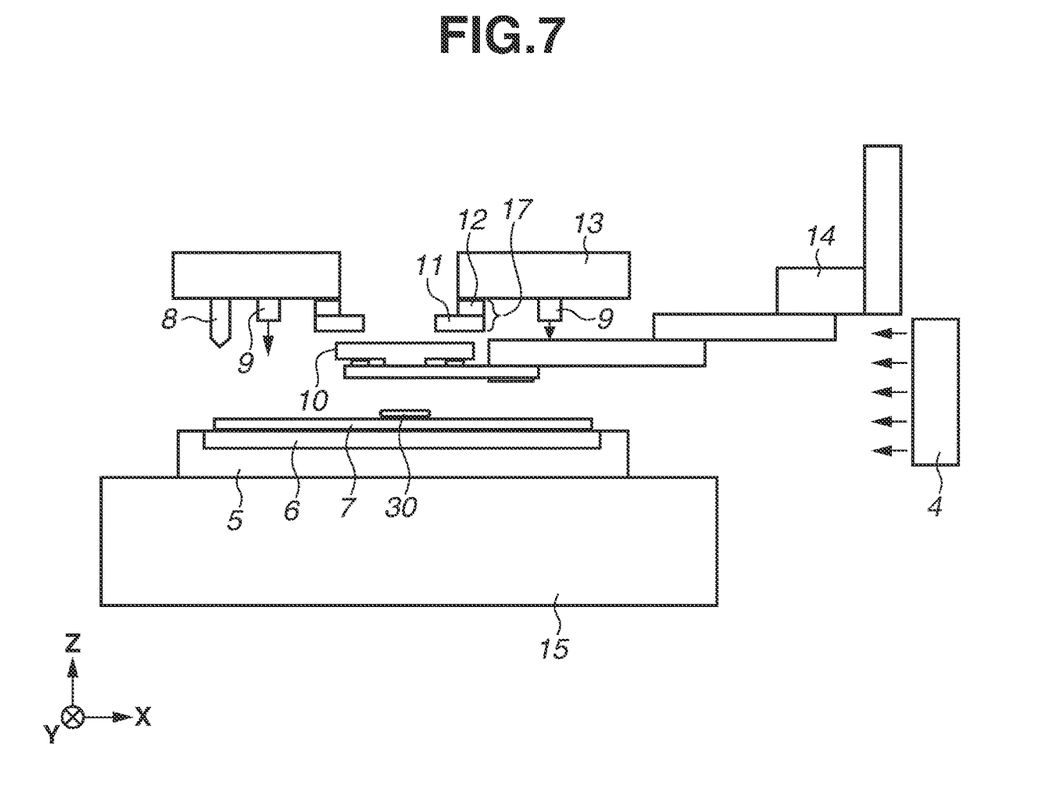
FIG. 7 is a diagram illustrating the mold conveying unit holding the mold.
Figure 8:
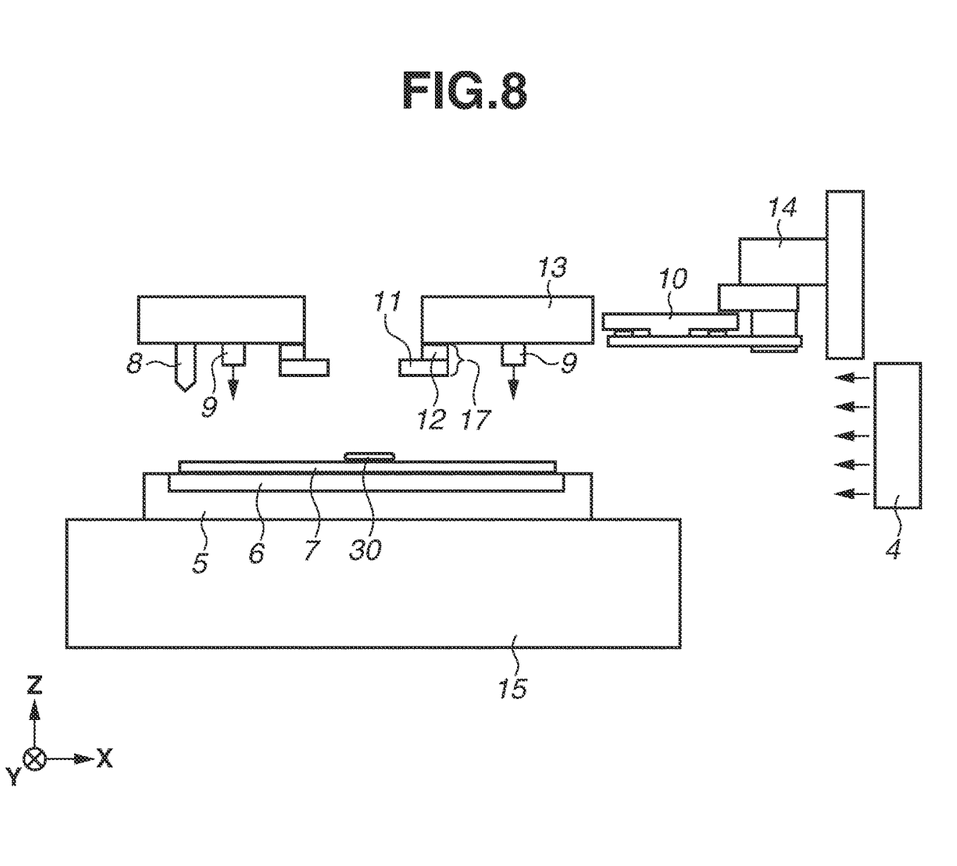
FIG. 8 is a diagram illustrating the mold conveying unit holding the mold at the standby position.

Next, in step S202, the mold conveying unit 14 carries the mold 10 out of the mold holding unit 17. As illustrated in FIG. 6, the holding force of the mold holding unit 17 holding the mold 10 is weakened in the state where the hand portion of the mold conveying unit 14 and the mold 10 are in contact with each other, whereby the mold 10 is delivered to the mold conveying unit 14, and the mold conveying unit 14 holds the mold 10. Then, as illustrated in FIG. 7, the mold conveying unit 14 holding the mold 10 moves down (in a −Z-axis direction). Then, as illustrated in FIG. 8, the mold conveying unit 14 holding the mold 10 moves to the right (in a +X-axis direction), then moves up (in a +Z-axis direction), and moves to the standby position. In the state where the mold conveying unit 14 is located at the standby position, the mold conveying unit 14 is not inside the object space, but outside the object space.

Next, in step S203, the mold conveying unit 14 carries the mold 10 into a mold storage unit (not illustrated) for storing the mold 10. At this time, as illustrated in FIG. 8, the mold conveying unit 14 is not inside the object space. During a predetermined period after the mold conveying unit 14 exits the object space, the amount of supply from the first supply unit 4 and the amount of supply from the second supply unit 9 are $L_{12}$ and $L_{22}$, respectively. Further, as the predetermined period, the period from when the mold conveying unit 14 exits the object space to when the mold conveying unit 14 enters the object space again may be determined in advance by an experiment or a simulation. In this case, to collect a foreign substance scattered by the mold conveying unit 14 entering the object space, $L_{12}$ is set to be greater than $L_{11}$. For example, $L_{12}$ may be set to 110% or more of $L_{11}$. It may be more desirable to set $L_{12}$ to 130% or more (less than 250%) of $L_{11}$. Similarly, $L_{22}$ is set to be greater than $L_{21}$ to collect the foreign substance scattered by the mold conveying unit 14 entering the object space. For example, $L_{22}$ may be set to 110% or more of $L_{21}$. It may be more desirable to set $L_{22}$ to 130% or more (less than 250%) of $L_{21}$. Further, the amount of collection by the collection unit 3 may be similarly controlled.

Next, in step S204, the mold conveying unit 14 carries the mold 10 out of the mold storage unit. At this time, as the mold 10 to be carried out, a mold different from the mold 10 carried out of the mold holding unit 17 may be carried out, or for example, after the mold 10 carried out of the mold holding unit 17 is cleaned, the same mold may be carried out.

Next, in step S205, as illustrated in FIG. 7, the mold conveying unit 14 moves to the mold holding unit 17 with holding the mold 10. Then, in step S206, as illustrated in FIG. 6, the mold conveying unit 14 moves up (in the +Z-axis direction). Then, the holding force of the mold holding unit 17 holding the mold 10 is strengthened in the state where the mold holding unit 17 and the mold 10 are in contact with each other, whereby the mold 10 is delivered to the mold holding unit 17, and the mold holding unit 17 holds the mold 10. Then, as illustrated in FIG. 5, the mold conveying unit 14 moves down (in the −Z-axis direction). As described above, the mold conveying unit 14 moves to the position where the mold conveying unit 14 can carry the mold 10 into the mold holding unit 17. That is, the mold conveying unit 14 enters the object space. The amount of supply from the first supply unit 4 and the amount of supply from the second supply unit 9 at this time are $L_{13}$ and $L_{23}$, respectively. In this case, to prevent a foreign substance from being scattered, $L_{13}$ is set to be smaller than $L_{12}$. For example, $L_{13}$ may be set to 90% or less of $L_{12}$. It may be more desirable to set $L_{13}$ to 70% or less (40% or more) of $L_{12}$. Similarly, $L_{23}$ is set to be smaller than $L_{22}$ to prevent the foreign substance from being scattered. For example, $L_{23}$ may be set to 90% or less of $L_{22}$. It may be more desirable to set $L_{23}$ to 70% or less (40% or more) of $L_{22}$. Further, similarly to the first exemplary embodiment, $L_{13}$ may be set to be greater than $L_{12}$ depending on the foreign substance that can be scattered. For example, $L_{13}$ may be set to 110% or more of $L_{12}$. It may be more desirable to set $L_{13}$ to 130% or more (less than 250%) of $L_{12}$. Further, similarly to the first exemplary embodiment, $L_{23}$ may be set to be greater than $L_{22}$ depending on the foreign substance that can be scattered. For example, $L_{23}$ may be set to 110% or more of $L_{22}$. It may be more desirable to set $L_{23}$ to 130% or more (less than 250%) of $L_{22}$. Further, the amount of collection by the collection unit 3 may be similarly controlled.

Next, in step S207, as illustrated in FIG. 4, the mold conveying unit 14 moves to the standby position. At this time, the mold conveying unit 14 is not inside the object space. Further, the amount of supply from the first supply unit 4 and the amount of supply from the second supply unit 9 at this time are $L_{14}$ and $L_{24}$, respectively. In this case, to collect a foreign substance scattered in the object space by the mold conveying unit 14 entering the object space, $L_{14}$ is set to be greater than either one of $L_{12}$ and $L_{13}$. For example, $L_{14}$ may be set to 110% or more of either one of $L_{12}$ and $L_{13}$. It may be more desirable to set $L_{14}$ to 130% or more (less than 250%) of $L_{13}$. Similarly, to collect the foreign substance scattered by the mold conveying unit 14 entering the object space, $L_{24}$ may be set to be greater than either one of $L_{22}$ and $L_{23}$. For example, $L_{24}$ may be set to 110% or more of either one of $L_{22}$ and $L_{23}$. It may be more desirable to set $L_{24}$ to 130% or more (less than 250%) of $L_{23}$. Further, the amount of collection by the collection unit 3 may be similarly controlled.

Further, in the present exemplary embodiment, a case has been described where the mold conveying unit 14 conveys the mold 10. Also in a case where the substrate conveying unit 16 conveys the substrate 7, it is, similarly, possible to prevent a foreign substance from being attached to the mold 10 or the substrate 7 by controlling the amount of supply from the first supply unit 4 and the amount of supply from the second supply unit 9.

Based on the above, according to the imprint apparatus according to the present exemplary embodiment, it is possible to prevent a foreign substance from being attached to the mold 10 or the substrate 7 by controlling the amount of supply from at least either one of the first supply unit 4 and the second supply unit 9. Further, it is possible to prevent a foreign substance from being attached to the mold 10 or the substrate 7 by controlling the amount of collection by the collection unit 3.

(Method for Manufacturing Article)

The pattern of a cured product formed using an imprint apparatus is permanently used in at least a part of each of various articles, or temporarily used to manufacture various articles. Examples of the article include an electric circuit element, an optical element, a microelectromechanical systems (MEMS), a recording element, a sensor, and a mold. Examples of the electric circuit element include volatile or non-volatile semiconductor memories such as a dynamic random-access memory (DRAM), a static random-access memory (SRAM), a flash memory, and a magnetoresistive random-access memory (MRAM), and semiconductor devices such as a large-scale integration (LSI) device, a charge-coupled device (CCD), an image sensor, and a field-programmable gate array (FPGA). Examples of the mold include a mold for imprint.

The pattern of the cured product is used as it is as a component member of at least a part of the article, or temporarily used as a resist mask. After etching or ion implantation is performed in the step of processing a substrate, the resist mask is removed.

Figure 9A:
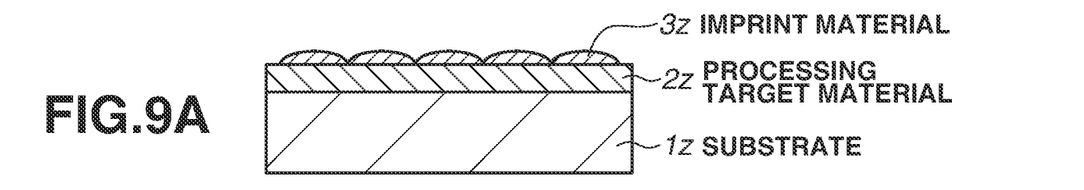
FIGS. 9A to 9F are diagrams illustrating a method for manufacturing an article.

Next, a specific method for manufacturing an article is described. As illustrated in FIG. 9A, a substrate 1z, such as a silicon wafer, on the surface of which a processing target material 2z, such as an insulator, is formed, is prepared. Next, an imprint material 3z is applied to the surface of the processing target material 2z by an inkjet method. FIG. 9A illustrates the state where the imprint material 3z formed of a plurality of droplets is applied onto the substrate 1z.

Figure 9B:
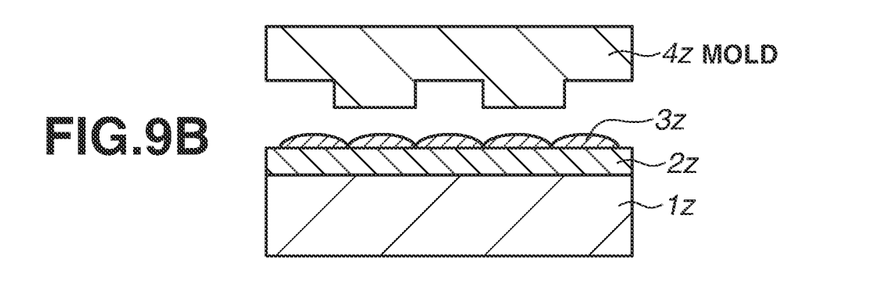
Figure 9C:
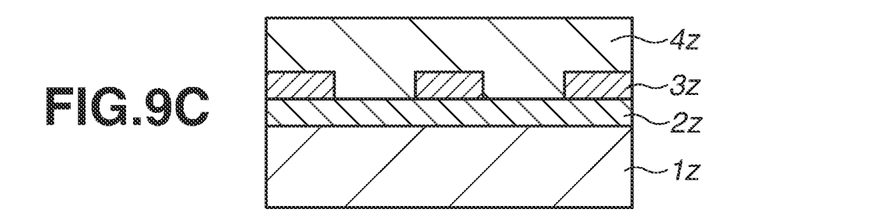

As illustrated in FIG. 9B, the side of a mold 4z for imprint where an uneven pattern is formed is directed at and opposed to the imprint material 3z on the substrate 1z. As illustrated in FIG. 9C, the substrate 1z onto which the imprint material 3z is applied and the mold 4z are brought into contact with each other, and pressure is applied to the imprint material 3z and the mold 4z. The imprint material 3z fills the gap between the mold 4z and the processing target material 2z. If the imprint material 3z is irradiated with light as curing energy through the mold 4z in this state, the imprint material 3z cures.

Figure 9D:
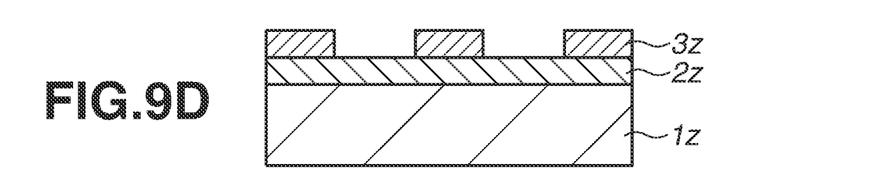

As illustrated in FIG. 9D, when the mold 4z and the substrate 1z are pulled away from each other after the imprint material 3z is caused to cure, the pattern of the cured product of the imprint material 3z is formed on the substrate 1z. This pattern of the cured product has such a shape that a recessed portion of the mold 4z corresponds to a protruding portion of the cured product, and a protruding portion of the mold 4z corresponds to a recessed portion of the cured product. That is, the uneven pattern of the mold 4z is transferred to the imprint material 3z.

Figure 9E:
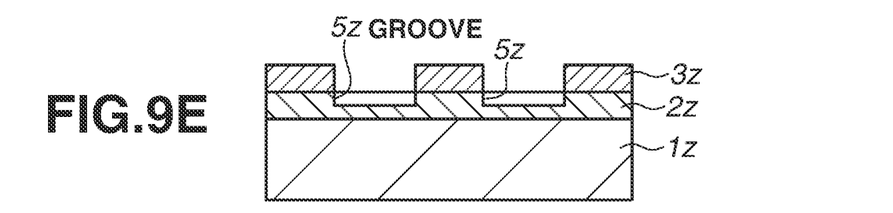
Figure 9F:
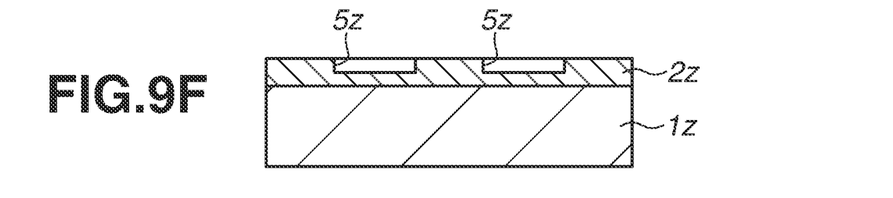

As illustrated in FIG. 9E, if etching is performed using the pattern of the cured product as an etching-resistant mask, a portion where the cured product is not present or the cured product thinly remains is removed from the surface of the processing target material 2z, thereby forming a groove 5z. As illustrated in FIG. 9F, if the pattern of the cured product is removed, an article in which the groove 5z is formed on the surface of the processing target material 2z can be obtained. In this case, the pattern of the cured product is removed. Alternatively, the pattern of the cured product may not be removed even after the processing and used as, for example, an interlayer insulating film included in a semiconductor device, i.e., a component member of the article.

An example has been described where a mold for transferring a circuit pattern in which an uneven pattern is provided is used as the mold 4z. Alternatively, a mold (a blank template) including a planar portion without an uneven pattern may be used. The blank template is used in a planarization apparatus (a molding apparatus) for performing a planarization process (a molding process) for molding a composition on a substrate by planarizing the composition on the substrate using the planar portion. The planarization process includes the step of, in the state where a curable composition supplied onto the substrate is in contact with the planar portion of the blank template, causing the curable composition to cure by irradiating the curable composition with light or heating the curable composition.

While exemplary embodiments of the present disclosure have been described, the present invention is not limited to these exemplary embodiments, and the present invention can be modified and changed in various manners within the scope of the present invention.

As an example of the molding apparatus, an imprint apparatus for molding an imprint material on a substrate using a mold, and forming a pattern on the substrate has been described. The molding apparatus, however, is not limited to an imprint apparatus. As an example of the molding apparatus, a planarization apparatus for performing a planarization process (a molding process) for molding a composition on a substrate by planarizing the composition on the substrate using a mold (a blank template) including a planar portion without an uneven pattern as a mold may be employed.

Further, the first and second exemplary embodiments can be implemented individually or in combination.

According to the present disclosure, it is possible to provide a molding apparatus, a molding method, and a method for manufacturing an article that are capable of preventing a foreign substance from being attached to a mold or a substrate.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-044356, filed Mar. 12, 2018, which is hereby incorporated by reference herein in its entirety.

What is claimed is:

1. A molding apparatus for molding a composition on a substrate using a mold, the molding apparatus comprising: a conveying unit having a hand portion configured to hold an object and an arm portion to which the hand portion is attached, the conveying unit being configured to convey the object; a holding unit configured to hold the object conveyed by the conveying unit; a supply unit configured to supply gas in a direction toward an object space such that the gas passes through the object space, the object space being a space surrounding the object held by the holding unit; and a control unit configured to determine a first amount of supply of the gas per unit time and a second amount of supply of the gas per unit time, the second amount being larger than the first amount and control the supply unit so that the first amount of the gas is supplied in a case where at least one of the hand portion or the arm portion is inside the object space and where the direction in which the gas supplied from the supply unit flows is changed by the at least one of the hand portion or the arm portion to a direction different from the direction toward the object space, and the second amount of the gas is supplied in a case where both the hand portion and the arm portion are outside the object space.

2. The molding apparatus according to claim 1, wherein the control unit controls the supply unit so that the second amount of supply is greater than the first amount of supply during a predetermined period after the hand portion and the arm portion exit the object space.

3. The molding apparatus according to claim 1, wherein the control unit controls the supply unit to supply the gas by the second amount of supply determined to suppress an increase in a foreign substance included in the object space.

4. The molding apparatus according to claim 1, further comprising a collection unit configured to collect gas from the object space,
wherein the control unit controls the collection unit so that a first amount of collection per unit time of the gas to be collected by the collection unit in a case where at least one of the hand portion and the arm portion is inside the object space is different from a second amount of collection per unit time of the gas to be collected by the collection unit in a case where the hand portion and the arm portion are outside the object space.

5. The molding apparatus according to claim 4, wherein the control unit controls the collection unit so that the second amount of collection is greater than the first amount of collection during a predetermined period after the hand portion and the arm portion exit the object space.

6. The molding apparatus according to claim 4, wherein the control unit controls the collection unit to collect the gas by the second amount of collection determined to suppress an increase in a foreign substance included in the object space.

7. The molding apparatus according to claim 4, wherein the control unit controls the collection unit to collect the gas by the second amount of collection according to an attribute of a foreign substance existing in the molding apparatus.

8. The molding apparatus according to claim 1, wherein the supply unit supplies the gas so that the gas flows in a direction parallel to a holding surface on which the holding unit holds the object.

9. The molding apparatus according to claim 1, wherein the supply unit supplies the gas so that the gas flows in a direction perpendicular to a holding surface on which the holding unit holds the object.

10. The molding apparatus according to claim 1, wherein the object is the mold or the substrate.

11. The molding apparatus according to claim 1, wherein the molding apparatus brings a pattern of the mold into contact with the composition to form a pattern of the composition.

12. The molding apparatus according to claim 1, wherein the molding apparatus brings a planar portion of the mold into contact with the composition to planarize the composition.

13. The molding apparatus according to claim 1,
wherein the control unit controls the supply unit so that, in a case where a foreign substance existing in the molding apparatus is less likely to be scattered by the gas supplied from the supply unit, the first amount of supply is smaller than the second amount of supply, and, in a case where the foreign substance is likely to be scattered by the gas supplied from the supply unit, the first amount of supply is greater than the second amount of supply, and
wherein the foreign substance being less likely or likely to be scattered is predetermined based on an attribute of the foreign substance.

14. The molding apparatus according to claim 4,
wherein the control unit controls the collection unit so that, in a case where a foreign substance existing in the molding apparatus is less likely to be scattered by the gas supplied from the supply unit, the first amount of collection is smaller than the second amount of collection, and, in a case where the foreign substance is likely to be scattered by the gas supplied from the supply unit, the first amount of collection is greater than the second amount of collection, and
wherein the foreign substance being less likely or likely to be scattered is predetermined based on an attribute of the foreign substance.

15. A molding method for molding a composition on a substrate using a mold, the molding method comprising: controlling a supply unit configured to supply gas in a direction toward an object space such that the gas passes through the object space, the object space being a space surrounding an object held by a holding unit; and forming a composition on the substrate using the mold after the controlling of the supply unit, in the controlling of the supply unit: conveying the object to the holding unit using a conveying unit having a hand portion configured to hold the object and an arm portion to which the hand portion is attached; determining a first amount of supply of the gas per unit time and a second amount of supply of the gas per unit time, the second amount being larger than the first amount and controlling the supply unit so that the first amount of the gas is supplied in a case where at least one of the hand portion or the arm portion is inside the object space and where the direction in which the gas supplied from the supply unit flows is changed by the at least one of the hand portion or the arm portion to a direction different from the direction toward the object space, and the second amount of the gas is supplied in a case where both the hand portion and the arm portion are outside the object space.

16. A method for manufacturing an article, the method comprising: controlling a supply unit configured to supply gas in a direction toward an object space such that the gas passes through the object space, the object space being a space surrounding an object held by a holding unit; forming a composition on a substrate using a mold after the controlling of the supply unit; processing the substrate on which the composition is formed; and manufacturing an article from the processed substrate, in the controlling of the supply unit: conveying the object to the holding unit using a conveying unit having a hand portion configured to hold an the object and an arm portion to which the hand portion is attached; determining a first amount of supply of the gas per unit time and a second amount of supply of the gas per unit time, the second amount being larger than the first amount and controlling the supply unit so that the first amount of the gas is supplied in a case where at least one of the hand portion or the arm portion is inside the object space and where the direction in which the gas supplied from the supply unit flows is changed by the at least one of the hand portion or the arm portion to a direction different from the direction toward the object space, and the second amount of the gas is supplied in a case where both the hand portion and the arm portion are outside the object space.

\* \* \* \* \*